(12) United States Patent
Yamamoto

(10) Patent No.: US 7,553,775 B2
(45) Date of Patent: Jun. 30, 2009

(54) METHOD FOR COATING SEMICONDUCTOR SURFACE, PROCESS FOR PRODUCTION OF SEMICONDUCTOR PARTICLES USING SAID METHOD, AND OPTICAL ELEMENT USING SAID SEMICONDUCTOR PARTICLES

(75) Inventor: Kazushige Yamamoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 577 days.

(21) Appl. No.: 11/182,865

(22) Filed: Jul. 18, 2005

(65) Prior Publication Data
US 2006/0046447 A1 Mar. 2, 2006

(30) Foreign Application Priority Data
Aug. 30, 2004 (JP) ............................. 2004-250008

(51) Int. Cl.
*H01L 21/31* (2006.01)
*H01L 21/469* (2006.01)
*H01L 21/302* (2006.01)

(52) U.S. Cl. ..................... 438/762; 438/763; 438/689
(58) Field of Classification Search ................. 438/762, 438/763
See application file for complete search history.

(56) References Cited

U.S. PATENT DOCUMENTS 7,288,468 B2 * 10/2007 Jang et al. .................... 438/500
2005/0070106 A1 * 3/2005 Kauzlarich et al. .......... 438/689

OTHER PUBLICATIONS

Akira Watanabe, et al., "Soluble Three-Dimensional Polysilane with Organosilicon Nanocluster Structure", Jpn. J. Appl. Phys., vol. 36, Sep. 15, 1997, pp. L 1265-L 1267.

James R. Heath, "A Liquid-Solution-Phase Synthesis of Crystalline Silicon", Science, vol. 258, Nov. 13, 1992, pp. 1131-1133.

Richard K. Baldwin, et al., "Solution Reduction Synthesis of Surface Stabilized Silicon Nanoparticles", Chem. Commun., 2002, pp. 1822-1823.

* cited by examiner

*Primary Examiner*—Ha Tran T Nguyen
*Assistant Examiner*—Valerie Brown
(74) *Attorney, Agent, or Firm*—Oblon, Spivak, McClelland, Maier & Neustadt, P.C.

(57) ABSTRACT

The present invention provides a method for coating a group 4 semiconductor surface composed mainly of a group 4 semiconductor elements and a process for producing group 4 semiconductor particles having a luminescent capability and semiconductor particles and a semiconductor element produced thereby. The method for coating a semiconductor surface according to the present invention comprises the steps of: providing a semiconductor material comprising a group 4 element selected from the group consisting of silicon, germanium, carbon, and tin; reacting the surface of the semiconductor material with an inert organic solvent-soluble and electron-donating reducing agent in the inert organic solvent to coat the surface of the semiconductor material with a metal derived from said reducing agent; and then reacting the surface of the semiconductor material with a compound with an electron withdrawing group, said compound comprising an element selected from the group consisting of group 4 elements and transition metal elements, to coat the surface of the semiconductor material with the group 4 element or the transition metal element derived from said compound with the electron withdrawing group. The utilization of this method can produce semiconductor particles or a semiconductor element such as a light emitting element and an optical modulator.

13 Claims, 6 Drawing Sheets

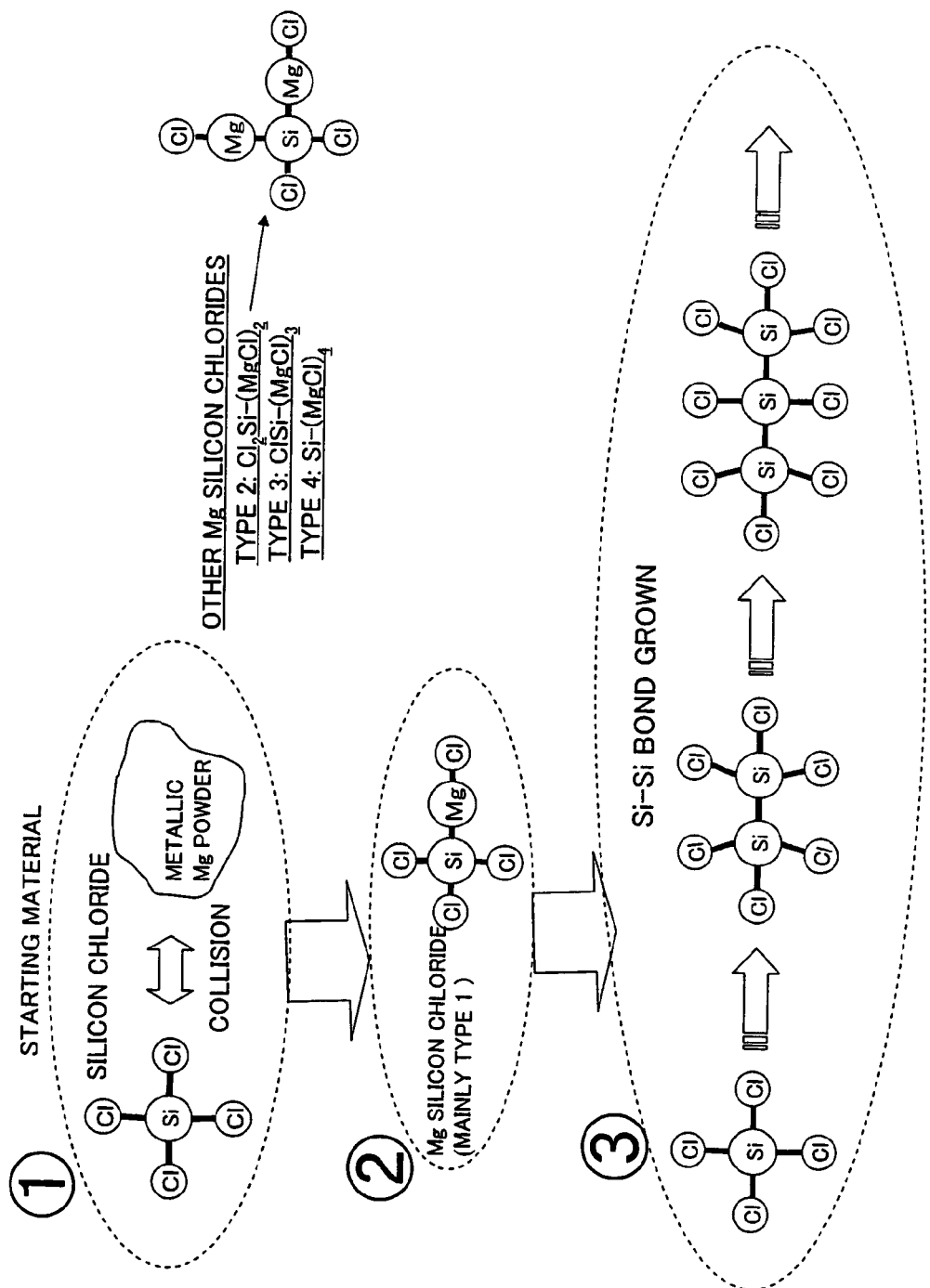
F I G. 1

METHOD FOR COATING SEMICONDUCTOR SURFACE, PROCESS FOR PRODUCTION OF SEMICONDUCTOR PARTICLES USING SAID METHOD, AND OPTICAL ELEMENT USING SAID SEMICONDUCTOR PARTICLES

CROSS-REFERENCE TO RELATED APPLICATIONS

This application is based upon and claims the benefit of priority from the prior Japanese Patent Applications No. 250008/2004, filed on Aug. 30, 2004; the entire contents of which are incorporated herein by reference.

BACKGROUND OF THE INVENTION

1. Field of the Invention

The present invention relates to a method for coating a group 4 semiconductor surface composed mainly of a group 4 semiconductor element such as silicon, germanium, carbon, tin and/or lead with a group 4 element or a transition metal element, a process for the production of nanoparticles utilizing said method, and a light emitting element using said nanoparticles, and an optical element such as an optical modulator based on electrooptic effect.

2. Background Art

Research for silicon as an optical material aiming at application to optical information communication fields is historically old and has been carried out for a long period from the middle the 1980's up to the present date. As compared with research for newer optical materials such as indium phosphorus, gallium arsenic, and lithium niobate as an insulator which are group III-V compounds, however, research for silicon has not been advanced.

There are two major reasons for this. The first reason is that silicon does not have any light emission mechanism. That is, silicon does not exhibit luminescence. Secondly silicon does not exhibit any electrooptic effect (EO effect) such as Pockels effect and Kerr effect. These reasons limit the technical application range of silicon, and, thus, it is considered that silicon has not drawn attention as optical materials. EO effect is a generic term for a phenomenon in which the application of an external electric field to a transparent material causes a refractive index change. When the refractive index change is proportional to the intensity of the electric field, this phenomenon is called "Pockels effect," while, when the refractive index change is proportional to the square of the intensity of the electric field, the phenomenon is called "Kerr effect."

The reason why silicon does not exhibit luminescence is that silicon is a semiconductor material having an indirect band gap and thus has a crystal structure which cannot produce an efficient light emitting element such as semiconductor lasers. By contrast, indium phosphorus and gallium arsenic as group III-V compounds are semiconductor materials having a direct band gap and thus have often been used as semiconductor laser materials.

The reason why silicon does not have any EO effect is that the crystal structure is highly symmetrical. When a material having EO effect is used, high-speed modulation of laser beams can be realized. More specifically, the preparation of an optical modulator for converting electric signals to light signals can be realized. In fact, an optical modulator has been prepared using lithium niobate having Pockels effect and has been extensively used in the field of optical fiber communication.

Six representative material techniques which have been studied for providing imparting luminescent function to silicon are summarized in Table 1. Specifically, for liquid phase synthesized silicon nanoparticles, rare earth ion doping, gas phase synthesized silicon cluster, porous silicon, silicide semiconductor, and strained superlattice, problems and the like are shown in this table.

TABLE 1

| | Related art involving luminescence of Si | Luminescent site | Main luminescence wavelength | Luminescence quantum yield | Structure controllability | Problem/remarks |
|---|---|---|---|---|---|---|
| 1 | Liquid phase synthesized nanoparticle * Grignard method | Nano-particle | 400 nm | 10% | X | Luminescence in the region from green to red is hardly seen due to small particle diameters (small particle problem). |
| 2 | Rare earth ion doping (Er) | Er | 1500 nm | 10% | X | Er ions are substantially insoluble in Si, making it impossible to ensure luminescence intensity. |
| 3 | Gas phase synthesized cluster | Cluster | 900 nm | 1% | X | Etching is necessary for obtaining visible luminescence due to large particle diameter (large particle problem). |
| 4 | Porous silicon (Si/SiO$_2$) | Nano-particle? Surface? | 600 nm | 1% | X | Reduction in particle diameter by etching is again necessary for obtaining luminescence in the region from blue to green. |
| 5 | Silicide semiconductor (β-FeSi$_2$) | FeSi$_2$ | 1500 nm | Unknown | X | Indirect semiconductor when determined based on calculation. Luminous upon straining. Luminescence intensity is very weak at room temperature. |
| 6 | Strained superlattice (Si/SiGe) | Si/SiGe | 1000 nm | Unknown | X | Visible luminescence is not observed. Under development as high-mobility material rather than luminescent material. |

It is first concluded that all the material techniques have not been led to efficient luminescence of silicon materials. The first technique, the liquid phase synthesized silicon nanoparticles, suffers from a "small particle problem" due to which only nanoparticles with small diameters can be produced. Due to excessively small diameters of the liquid phase synthesized silicon nanoparticles, luminescence takes place mainly from ultraviolet to a blue-violet region, and luminescence in a visible region is difficult.

For the second technique, the rare earth ion doping (Er ion doping), luminescent Er ions are substantially insoluble in the silicon crystal, rendering doping difficult. Consequently, luminescence is disadvantageously difficult.

In contrast to the liquid phase synthesized silicon nanoparticles, the third technique, the gas phase synthesized silicon cluster, suffers from a "large particle problem" in which only particles with large diameters can be produced. The cluster mainly emits light only in an infrared region and does not emit light in a visible region.

As with the gas phase synthesized silicon cluster, the fourth technique, the porous silicon, suffers from a "large particle problem." In anode oxidation, since the particle diameter is large, luminescence in a red region is possible, but on the other hand, luminescence in a blue or green region is less likely to occur.

The fifth technique, the silicide semiconductor (mainly $\beta$-$FeSi_2$), cannot disadvantageously emit light without introduction of stains into the material. Both the results of calculation and the results of experiments show that $\beta$-$FeSi_2$ is a semiconductor having an indirect band gap, that is, have revealed that $\beta$-$FeSi_2$ is essentially a non-luminescent material.

For the sixth technique, the strained superlattice (Si/SiGe), suffers from a problem that particles having this superlattice hardly emit light. It is being clarified that SiGe is inherently a semiconductor having an indirect band gap, due to which luminescence does not occur without difficulties.

As described above, the conventional material techniques which aim to impart luminescence function to silicon materials could not have actually led to realization of efficient luminescence of silicon materials.

Imparting a luminescent function to silicon can bring about a significant advance of electronics for the following reasons and can be expected to greatly contribute to realization of a wealthy future society.

In the coming future society, it is considered that there would be an ever-increasing social demand for full utilization of information and an ultrahigh speed which is higher than the current speed would be required of electronics including LSIs. Due to this tendency, it is predicted that the signal source in the information processing and the information transmission would be shifted from electrons, the current leader, to light having the maximum information processing and transmission speeds.

In the field of optical information communication, replacement of individual optical devices supporting optical fiber communication from the viewpoint of hardwares. (for example, semiconductor lasers and optical modulators) with silicon would lead to the arrival of time in which LSI and optical fibers are integrated on a silicon wafer, which in turn would lead to harmony of LSI and optical fibers to each other. This means that electronics is integrated with communication and information processing and transmission speeds are increased to the maximum of light speed. Accordingly, siliconization of optical devices can greatly contribute to the realization of ultrahigh speeds in various applications and social infrastructure where broadbands are required, for example, in personal computers, search (the Internet), image recognition systems, communications, and forecasts and predictions (computations and calculations).

As described above, however, the conventional material techniques involve an essential problem that efficient luminescence in silicon is impossible.

SUMMARY OF THE INVENTION

An object of the present invention is to provide, novel methods for imparting a luminescent function to group 4 semiconductor materials that are utterly different from the conventional methods, that is, a novel method for coating a semiconductor surface and a novel process for the production of liquid phase synthesized nanoparticles based on the same means, and to provide an optical element based on the group 4 semiconductor material to which the luminescent function has been imparted.

According to the present invention, there is provided a method for coating a semiconductor surface, comprising:

providing a semiconductor material comprising a group 4 element selected from the group consisting of silicon, germanium, carbon, and tin; reacting the surface of the semiconductor material with an inert organic solvent-soluble and electron-donating reducing agent in the inert organic solvent to coat the surface of the semiconductor material with a metal derived from said reducing agent; and then reacting the surface of the semiconductor material with a compound with an electron withdrawing group, said compound comprising an element selected from the group consisting of group 4 elements and transition metal elements, to coat the surface of the semiconductor material with the group 4 element or the transition metal element derived from said compound with the electron withdrawing group.

According to another aspect of the present invention, there is provided a process for producing semiconductor particles, comprising allowing crystal growth to proceed by the above method using seed crystals as the semiconductor material.

According to still another aspect of the present invention, there are provided semiconductor particles, which is produced by the above process for producing semiconductor particles.

According to a further aspect of the present invention, there is provided a light emitting element comprising a light emitting part which emits light by electrical or optical excitation, wherein said light emitting part comprises said semiconductor particles produced by the above process.

According to another aspect of the present invention, there is provided an optical modulator comprising an optical modulation part which emits light signal by electrical or optical light modulation, wherein said optical modulation part comprises said semiconductor particles produced by the above process.

In the process according to the present invention, a coating with a thickness and a composition regulated accurately on an atomic level can be formed on a semiconductor surface. Further, the application of the process to seed particles has realized for the first time the synthesis of group 4 semiconductor nanoparticles with regulated particle diameters and composition. Group 4 semiconductor nanoparticles, which are truly superior in luminescence characteristics such as tailor made luminescence wavelengths and improved luminescence efficiency, to group 4 semiconductor nanoparticles produced by other production processes have been realized for the first time by the present invention.

The use of the group 4 semiconductor nanoparticles produced by the production process of the present invention can realize siliconization of optical devices which can realize an increase in speed of LSIs to light speed. This can realize ultrahigh speeds in various applications and social infrastructure where broadbands are required, for example, in personal computers, search (the Internet), image recognition systems, communications, and forecasts and predictions (computations and calculations), and, thus, the present invention is very beneficial in industry.

BRIEF DESCRIPTION OF THE DRAWINGS

FIG. 1 is a conceptual diagram illustrating the conventional production process (Grignard method);

DETAILED DESCRIPTION OF THE INVENTION

Figure 2:
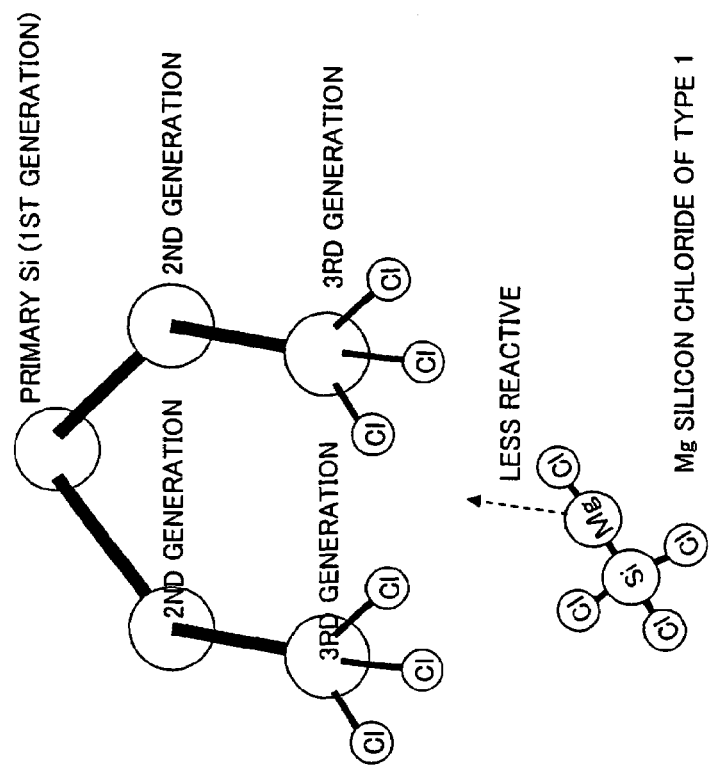
FIG. 2 is a typical diagram illustrating a small particle problem involved in the conventional production process (Grignard method), wherein (a) shows the structure of bulk crystal Si and (b) the structure of Si nanoparticles.
Figure 2:
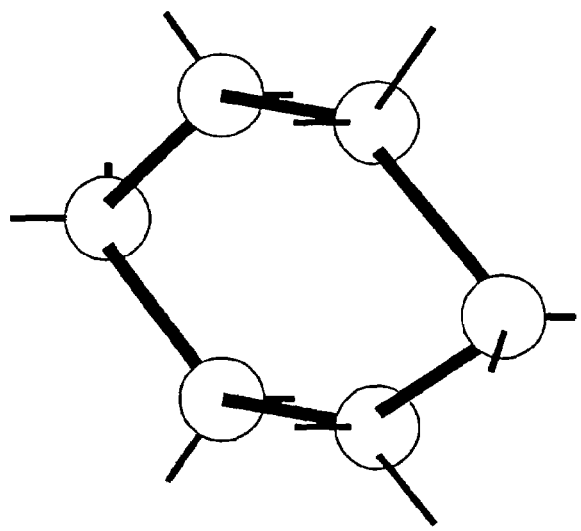

Embodiments of the present invention will be described in detail with reference to the accompanying drawings.

At the outset, in section 1, in order to clarify advantages and differentiating points of the present invention, the principle of a liquid phase synthetic process of nanoparticles called "Grignard method" which is one of conventional methods for imparting a luminescent function to a group 4 semiconductor material will be described by taking the synthesis of silicon nanoparticles as an example. Next, in section 2, the "small particle problem" which is a drawback involved in the Grignard method will be discussed to clarify why growth to particle diameters large enough to provide visible luminescence is difficult. Next, in section 3-a and section 3-b, the principle of the production process of nanoparticles according to the present invention will be described to indicate that the regulation of particle diameters accurately on an atomic level is possible and, unlike the Grignard method, large particle diameters can be realized and that visible luminescence in group 4 semiconductor nanoparticles, which is one object of the present invention, can be realized. In section 3-c, the principle of a method for covering a semiconductor surface according to the present invention will be described to indicate that imparting a luminescent function to group 4 semiconductor materials which is an object of the present invention can be realized.

1) Grignard Method

This is a technique in which, in a solution, a condensation reaction is utilized between silicon compound molecules to allow the Si—Si bond to grow three-dimensionally and thus to provide nanoparticles.

FIG. 1 is a typical diagram illustrating Si—Si bond formation and growth of the Si—Si bond. As can be seen from the drawing, starting materials used in the Grignard method are silicon chloride (liquid) and magnesium metal (powder). Dehydrated ethylene glycol dimethyl ether (hereinafter referred to as "glyme") is generally used as an inert organic solvent. In the glyme, the following reaction steps are carried out.

1. Silicon chloride is added to glyme containing metallic magnesium powder.
2. The mixture is stirred to allow silicon chloride to collide with metallic magnesium.
3. Magnesium silicon chloride molecules as a reaction intermediate are produced in situ by the collision.
4. Si—Si bond is formed by a molecule condensation reaction between silicon chloride and magnesium silicon chloride expressed by the following reaction formula:

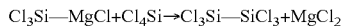

$$Cl_3Si\text{—}MgCl+Cl_4Si \rightarrow Cl_3Si\text{—}SiCl_3+MgCl_2$$

5. While stirring, the Si—Si bond is grown three-dimensionally.

As is apparent from the reaction formula in the reaction step 4, the Si—Si bond is formed by condensation reaction of —MgCl groups as a reactive site in magnesium silicon chloride molecules produced in situ in glyme with —Cl group as a counter reactive site in silicon chloride molecules. In this case, the —MgCl group is an electron-donating functional group, while the —Cl group is an electron-withdrawing functional group. Therefore, this chemical reaction is considered to take place by mutually electrical pulling between both the functional groups.

Magnesium silicon chloride molecules are classified into types 1 to 4 according to the number of magnesium atoms added. The probabilities of production of individual types are largely dependent upon the concentration of the silicon chloride molecules and the concentration of the metallic magnesium. Under ordinary conditions (under conditions of silicon chloride molecules:metallic magnesium molar ratio=1:1 to 1:4), type 1 is produced at a higher ratio relative to the other types, i.e., types 2, 3 and 4. The reason for this can be explained as follows. Specifically, magnesium silicon chloride molecules are produced by collision of silicon chloride molecules dissolved in the solution against the metallic magnesium powder insoluble in the solution. The probability of re-collision of the resultant magnesium silicon chloride molecules against the metallic magnesium is very low and, without the collision against the metallic magnesium, the magnesium silicon chloride molecules are reacted with other silicon chloride molecules dissolved in the solution and nanoparticles in the course of growth. For this reason, magnesium silicon chloride molecules of type 1 are produced at a higher ratio relative to the other types.

In the magnesium silicon chloride molecules of type 1, the number of reactive sites (≡Si—MgCl) per molecule is one, while the number of counter reactive sites (≡Si—Cl) per molecule is three. That is, the number of reactive sites is not identical to the number of counter reactive sites. This difference is causative of the small particle problem which will be described next.

2) Small Particle Problem Involved in Grignard Method

FIG. 2a is a typical diagram showing an atomic structure of crystalline silicon. The crystalline silicon has a diamond structure and, as shown in the drawing, has a six-membered ring.

FIG. 2b is a typical diagram showing silicon nanoparticles in an early stage of growth. In this drawing, growth of Si—Si bond from the first generation silicon atom (first atom) as a nucleus of a growth reaction to the silicon atom in the third generation is shown.

In order that silicon nanoparticles are grown in a diamond structure as in the crystalline silicon, magnesium silicon chloride molecules to be grown to the fourth generation silicon atoms should be reacted with two third generation silicon atoms to from a six-membered ring. To this end, the magnesium silicon chloride molecules to be reacted with the third generation silicon nanoparticles should be reacted with two counter reactive sites (≡Si—Cl) in the third generation silicon.

However, the usually produced magnesium silicon chloride molecules of type 1 have only one magnesium atom and thus have only one reactive site (≡Si—MgCl). Accordingly, it is apparent that a specific situation occurs in which the magnesium silicon chloride molecule cannot be surely reacted with either one of the third generation silicon atoms.

Here it is assumed that the magnesium silicon chloride molecule has been reacted with either one of the third generation silicon to cause growth of the fourth generation silicon. In this case, however, steric hindrance between the three —Cl groups to be added to the other third generation silicon atom remaining unreacted and the three —Cl groups to be added to the fourth generation silicon atoms is so large that the Si—Si bond between the third and fourth generations is unstable in terms of energy and thus is likely to be broken. For this reason, under conventional synthesis conditions (conditions of silicon chloride: metallic magnesium molar ratio=1:1 to 1:4), the growth of the fourth generation silicon is very difficult.

When the growth of nanoparticles has been stopped at such a stage that the silicon was grown to the third generation, the nanoparticle is constituted by only 17 atoms. The particle diameter of the nanoparticle at that time is estimated to be about 0.5 nm to 1 nm. The photoluminescence peak wavelength was measured and found to be about 350 to 400 nm. This particle size corresponds to one which emits light in an ultraviolet-bluish purple region.

From technical literature, it is estimated that, in order to achieve blue, green, and red light emissions by bringing silicon to nanoparticles, respectively, regulation of the particle diameter of 2 to 2.5 nm, regulation of the particle diameter of 2.5 to 3 nm, and regulation of the particle diameter of 3 to 5 nm are necessary. An increase in particle diameter with an increase in luminescence wavelength, that is, a change in luminescent color in the order of ultraviolet→blue→green→red is attributable to quantum confinement effect.

Thus, it is apparent that particle diameters produced by the Grignard method are too small to provide visible luminescence. This is the small particle problem inherent in the Grignard method. Likewise, the suppression of nanoparticle growth reaction for silicon is observed for the other group 4 elements, i.e., germanium, carbon, and tin, and this phenomenon is common to the synthesis of the group 4 semiconductor nanoparticles using the Grignard method.

3) Production Process of Semiconductor Nanoparticles and Method for Coating Semiconductor Surface According to the Present Invention Unlike the group 4 semiconductor nanoparticles, for nanoparticles of metals such as Au (gold), Ag (silver), Pt (platinum), Cu (copper), Fe (iron), Co (cobalt), and Ni (nickel), semiconductor nanoparticles of group II-VI compounds such as CdS, CdSe, CdTe, ZnS, ZnSe, and ZnTe, and semiconductor nanoparticles of group II-V compounds such as GaAs, InAs, and InP, the liquid phase synthesis method has been established. This is attributable to the fact that Au, Ag, Pt, Cu, Fe, Co, Ni, Cd (cadmium), Zn (zinc), S (sulfur), Se (selenium), Te (tellurium), Ga (gallium), In (indium), As (arsenic), and P (phosphorus) as the constituent atoms can be relatively stably present in the state of atomic ions in a solution, and, thus, crystal growth to metallic nanoparticles and compound semiconductor nanoparticles can be relatively easily regulated by basic experimental parameters such as time, reagent concentration, and temperature.

On the other hand, for group 4 atoms such as Si (silicon), Ge (germanium), C (carbon), and Sn (tin) except for plasma state created by CVD or the like, the state of atomic ions is very unstable, and, for example, silicon is generally present only in the form of compound molecules such as silicon chloride. Therefore, unlike nanoparticles of other materials, the chemical reaction in the liquid phase synthesis should be assembled based on a molecular condensation reaction.

The nature of Si—Si bond formation in the above-described Grignard method was the molecular condensation reaction between one electron-donating reactive site (≡Si—MgCl) in a certain molecule and one electron-withdrawing counter reactive site (≡Si—Cl) in another molecule. The small particle problem to be solved was attributable to the fact that, in the magnesium silicon chloride molecules and the silicon chloride molecules involved in the Si—Si bond formation, the number of electron-donating groups is not identical to the number of electron-withdrawing groups.

In order to realize a liquid phase synthesis method which can synthesize group 4 semiconductor nanoparticles as desired, in other words, a novel liquid phase synthesis method that can perform crystal growth to particles which has a desired chemical composition and a desired particle diameter and can emit light at a desired wavelength, the whole chemical reaction should be redesigned so that the number of electron-donating groups and the number of electron-withdrawing groups in molecules to be condensed should be always identical to each other.

Accordingly, the method for coating a semiconductor surface according to the present invention comprises: providing a semiconductor material comprising a group 4 element selected from the group consisting of silicon, germanium, carbon, and tin; reacting the surface of the semiconductor material with an inert organic solvent-soluble and electron-donating reducing agent in the inert organic solvent to coat the surface of the semiconductor material with a metal derived from said reducing agent; and then reacting the surface of the semiconductor material with a compound with an electron withdrawing group, said compound comprising an element selected from the group consisting of group 4 elements and transition metal elements, to coat the surface of the semiconductor material with the group 4 element or the transition metal element derived from said compound with the electron withdrawing group.

Figure 3:
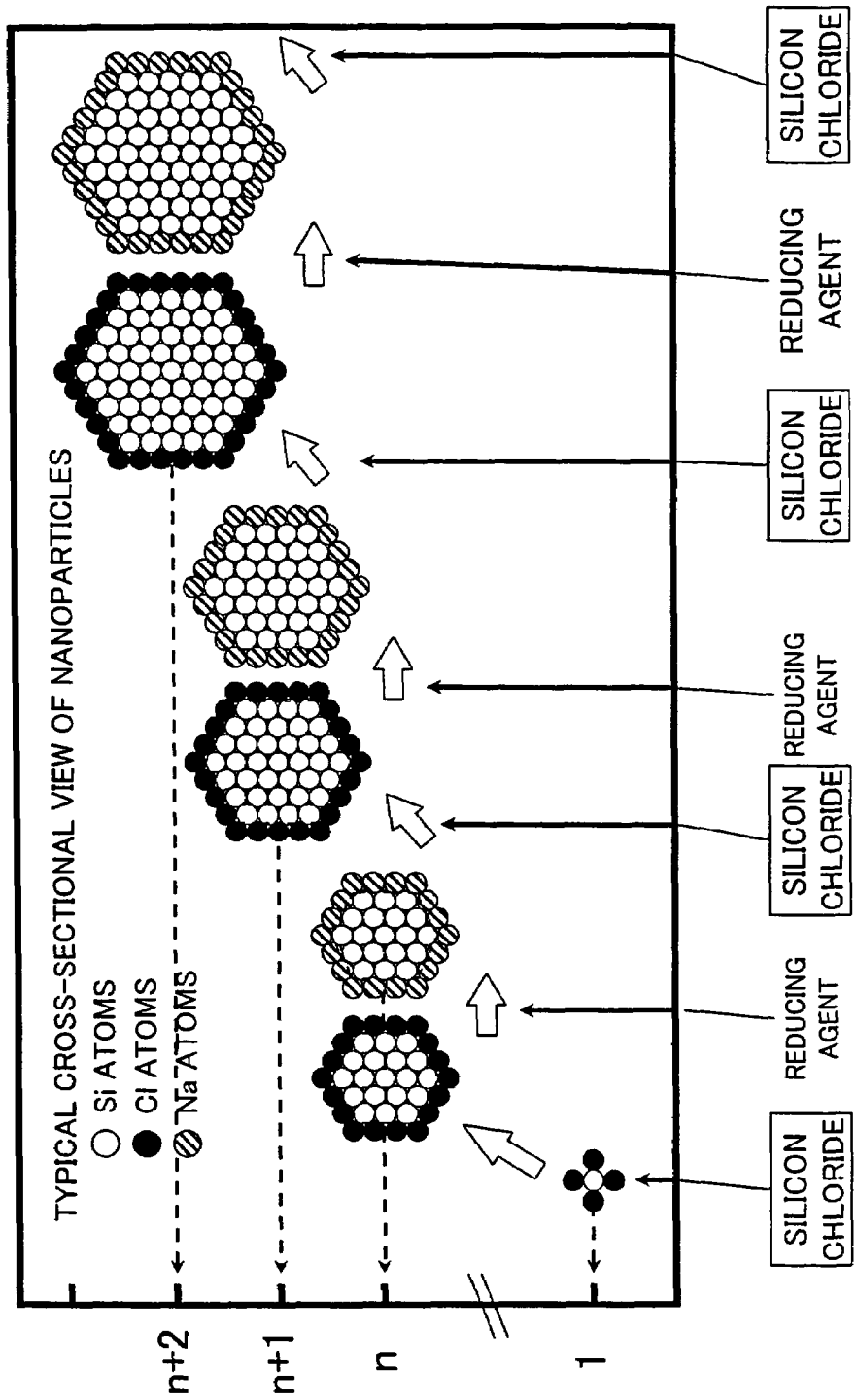
FIG. 3 is a typical diagram illustrating the synthesis of one-element group 4 semiconductor nanoparticles involved in the production process of the present invention.

FIG. 3 is a typical explanatory diagram of a process for the production of the most basic group 4 semiconductor nanoparticles in a liquid phase in which the method for coating a semiconductor surface according to the present invention has been applied to group 4 semiconductor particles. In FIG. 3, the abscissa represents reagent introduction procedure (synthesis procedure), and the ordinate represents the particle diameter of nanoparticles corresponding to this procedure.

In the production process according to the present invention, group 4 atom-containing compound molecules (for example, silicon chloride) as a compound with an electron withdrawing group and an inert organic solvent-soluble and electron-donating reducing agent (for example, a charge transfer complex such as sodium naphthalene or a rare earth iodide such as samarium diiodide) are provided, and both the materials are alternately added to the solution, and this addition is if necessary repeated, to coat a semiconductor surface. The application of this process to seed particles of semiconductor can realize the production of group 4 semiconductor nanoparticles. The process according to the present invention has realized for the first time the production of group 4 semiconductor nanoparticles with particle diameters and composition regulated accurately on an atomic level. As compared with the conventional nanoparticle, the group 4 nanoparticles thus prepared can realize luminescence at desired luminescence wavelengths with high luminescence efficiency.

The principle of 3-a) the production process of one-element group 4 semiconductor nanoparticles of a single element and 3-b) the production process of two-element group 4 compound semiconductor nanoparticles will be described. In the former production process 3-a), silicon nanoparticles will be taken as an example, and in the latter production process 3-b), germanium carbon compound nanoparticles will be taken as an example.

3-a) Production Process of One-Element Group 4 Semiconductor Nanoparticles

In one production process of semiconductor particles according to the present invention, in a group 4 semiconductor material selected from silicon, germanium, carbon, and tin, when a molecule composed of one group 4 atom A and four electron-withdrawing groups X (a compound with electron withdrawing groups) is represented by $AX_4$ while a charge transfer complex composed of one alkali atom M and one aromatic molecule Y is represented by MY, in chemically reacting the above molecule with the above charge transfer complex in an inert organic solvent, they are added repeatedly a plurality of times in the order of $AX_4$ and MY or in the order of MY and $AX_4$, whereby particles, particularly semiconductor nanoparticles, can be grown while regulating the size of a three-dimensional nanostructure of atom A on an atomic level.

The formation of silicon nanoparticles will be described as an example. Crystal growth of silicon nanoparticles having a diamond structure can be achieved on one atom generation basis by, according to the synthesis procedure shown in FIG. 3, alternately adding, to glyme, silicon chloride as a supply source of silicon atom and a solution of sodium naphthalene charge transfer complex (accurately, a $(sodium)^+$ $(naphthalene)^-$ charge transfer complex; hereinafter referred to as "NN complex") as a reducing agent for reducing silicon chloride in glyme.

The silicon nanoparticle formation will be described in more detail.

The NN complex is gradually added to glyme with silicon chloride previously dissolved therein to first produce silicon nanoparticles of certain generation which are used as seed crystals. The first produced nanoparticles as the seed crystals are nanoparticles having a chlorine-terminated surface. Upon subsequent continuous addition of the NN complex, the NN complex further acts on the surface of the nanoparticles. As a result, the surface chlorine atoms are reduced to NaCl which is then eliminated from the surface, and the naphthalene molecules as the reducing agent are oxidized from negative ions to neutral ions which are then dissolved in the solution. Finally, the whole surface of the nanoparticles is covered by sodium atoms derived from NN complex. When the silicon chloride molecule is again allowed to act on the nanoparticles having a sodium-terminated surface, the surface sodium atom is oxidized to NaCl which is then eliminated from the surface while silicon chloride loses its chlorine atom as a result of reduction and silicone atoms derived from silicone chloride is chemically bonded to the surface of the nanoparticles, whereby silicon nanoparticles are produced which has a silicon atom layer grown by just one atom generation and has a chlorine-terminated surface. In other words, a monoatomic layer of silicon atoms is formed on the surface of the particles. Thereafter, the NN complex and silicon chloride can be added in a regular order by N times to allow silicon nanoparticle crystals to be grown by N atom generation. That is, the particle diameter can be selectively grown to a large size by N atom generation.

Nanoparticles and, in addition, NaCl and neutralized naphthalene molecules are present together in the solution. Both the substances have been chemically changed to a stable state and thus are no longer reacted with the nanoparticles.

Figure 4:
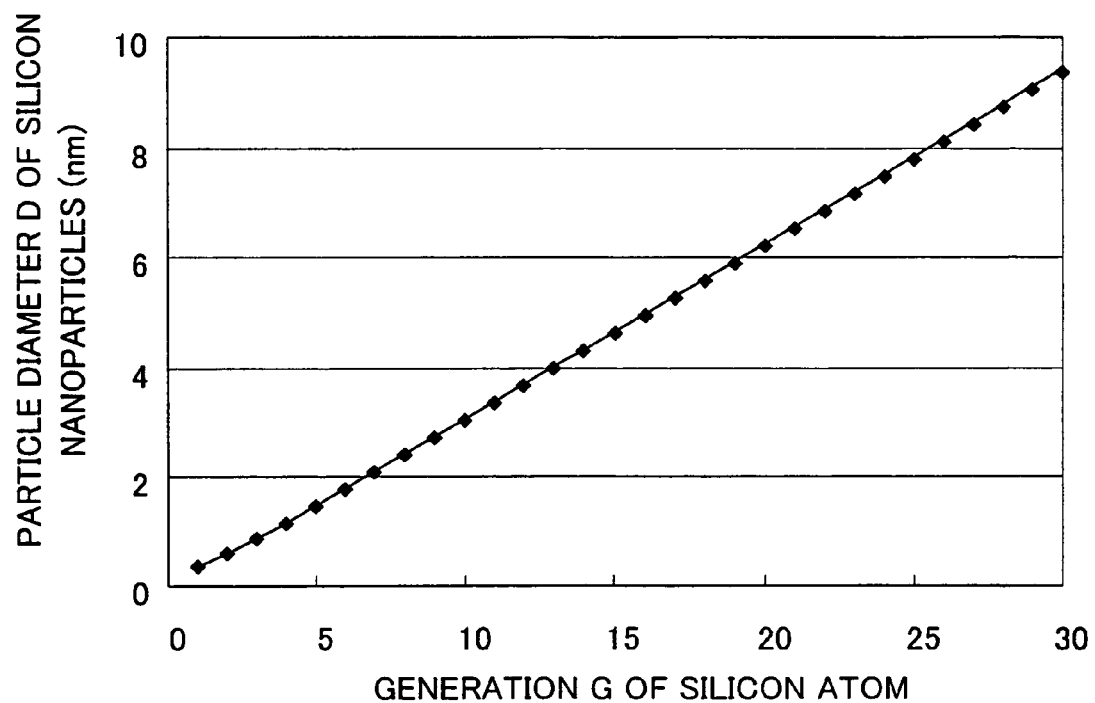
FIG. 4 is a diagram showing the results of calculation of particle diameters of silicon nanoparticles, produced according to the present invention, as a function of generation.

FIG. 4 shows the results of calculation of particle diameter D as a function of generation G of the silicon nanoparticles having a diamond structure produced by the process according to the present invention. The particle diameter D (nm) is an equivalent diameter, when the nanoparticles are assumed to be spherical, and can be estimated by the following equation:

$$D = a \times [3M/4\pi]^{1/3} \tag{1}$$

wherein a represents lattice constant of bulk crystal silicon (0.543 nm); and M represents the total number of silicon atoms constituting nanoparticles. Table 2 shows M values in nanoparticles having a diamond structure.

TABLE 2

M value of nanoparticles with diamond structure

| Generation G | Total number of atoms M |
| --- | --- |
| 1 | 1 |
| 2 | 5 |
| 3 | 17 |
| 4 | 41 |
| 5 | 83 |
| 6 | 147 |
| 7 | 239 |
| 8 | 363 |
| 9 | 525 |
| 10 | 729 |
| 11 | 981 |
| 12 | 1285 |
| 13 | 1647 |
| 14 | 2071 |
| 15 | 2563 |
| 16 | 3127 |
| 17 | 3769 |
| 18 | 4493 |
| 19 | 5305 |
| 20 | 6209 |
| 21 | 7211 |
| 22 | 8315 |
| 23 | 9527 |
| 24 | 10851 |
| 25 | 12293 |
| 26 | 13857 |
| 27 | 15549 |
| 28 | 17373 |
| 29 | 19335 |
| 30 | 21439 |
| 31 | 23691 |
| 32 | 26095 |

As can be seen from the drawing, the growth of the nanoparticles by one generation by the production process of the present invention can increase the particle diameter by about 0.3 nm. The visible luminescence of silicon nanoparticles is generally considered to take place when the particle diameter is not more than 10 nm, particularly 2 to 5 nm. Therefore, growth of nanoparticles to seventh to sixteenth generation is necessary for this. The generation of the primary seed crystal can be regulated by synthesis conditions (such as temperature, concentration, and stirring speed). The second to sixth generation seed crystals can easily be provided, and synthesis conditions of high temperature, low centration, and high-speed stirring can provide seed crystals of small generation having uniform size. Larger nanoparticles, for example, the seventh to sixteenth generation nanoparticle produced by the method according to the present invention can be used as seed crystals.

The use of an organic solvent-soluble and electron-donating reducing agent, for example, sodium naphthalene and samarium diiodide, as the reducing agent is one of important factors for realizing the production process according to the present invention. In the above explanation, the NN complex, a charge transfer complex, has been used as the reducing agent. However, other inert organic solvent-soluble and electron-donating reducing agents, for example, rare earth iodides, may also be used as the reducing agent. Various reducing agents are shown for comparison in Table 3.

TABLE 3

| | Reducing agent | | | |
|---|---|---|---|---|
| Index | Alkali metal Na, Li | Alkaline earth metal Mg | Metal hydride LiAlH$_4$, NaBH$_4$ | Invention Na naphthalene SmI$_2$ |
| Solubility | | | | |
| Soluble ○ Insoluble X | X | X | ○ | ○ |
| Reducing properties | | | | |
| Electron donating ○ Proton donating X | ○ | ○ | X | ○ |

Reducing agents are divided into two types, i.e., electron-donating reducing agents which give electrons to the counterpart and proton-donating reducing agents which give protons to the counterpart. In the proton-donating reducing agent, the chlorine atom covering the surface of the nanoparticles can be replaced with a hydrogen atom. However, it should be noted that, in some cases, silicon chloride is not reacted with hydrogen-terminated silicon nanoparticles in a low-temperature solution, making it impossible to regulate the growth of nanoparticles.

Table 3 shows that reducing agents include solvent-insoluble reducing agents and solvent-soluble reducing agents. In the solvent-insoluble reducing agents, the probability of collision of the nanoparticles against the reducing agent is substantially 0 (zero) and, thus, the chlorine-terminated surface of the nanoparticles remains unchanged. The chlorine-terminated silicon nanoparticles are less likely to react with silicon chloride and, thus, the growth of the nanoparticles cannot be regulated without difficulties.

In order to solve this problem, in the present invention, an inert organic solvent-soluble and electron-donating reducing agent is used as the reducing agent. Charge transfer complexes (combination of an electron-donating metal atom with an electron-accepting organic molecule) or rare earth iodides are preferred as such reducing agents. More specifically, charge transfer complexes include sodium-naphthalene complexes, lithium-naphthalene complexes, and lithium-di-t-butylbiphenyl, and rare earth iodides include samarium diiodide, yttrium diiodide, and europium diiodide. Particularly preferred rare earth iodides are divalent rare earth iodides.

Here the expression "inert organic solvent-soluble" means that the reducing agent in an amount large enough to carry out the method according to the present invention is soluble in the inert organic solvent. Accordingly, the necessary solubility varies depending upon the type of the inert organic solvent used in the method according to the present invention and the type of the reducing agent, and, thus, specific solubility is not limited. An example of the solubility of the reducing agent used in the present invention is preferably not less than 0.0005 mole/liter, more preferably not less than 0.001 mole/liter, in terms of solubility in glyme.

In the NN complex, sodium per se, as with magnesium, is usually an inert organic solvent-insoluble metallic powder. However, the complex, when combined with a solvent-soluble naphthalene molecule, can be solubilized in a solvent while maintaining the reducing ability.

Charge transfer complexes other than the NN complex may also be used as the reducing agent in the method according to the present invention so far as they have an electron-donating property and are soluble in solvents. In addition to sodium, the electron-donating metal atom may be selected from alkali metal atoms such as lithium, potassium, rubidium, and cesium, and, in addition to naphthalene, the electron-accepting organic molecule to be used in combination with the electron-donating metal atom can be selected from organic molecules having, in their molecular skeletons, various aromatic organic molecules including pyrene, anthracene, tetracene, perylene, phenanthrene, fluorene, and biphenyl. A lithium naphthalene complex is one of promising reducing agents.

Further, rare earth iodides may be mentioned as the reducing agent usable in the method according to the present invention. The rare earth iodide referred to herein is a reducing agent utilizing a change in valence of rare earth metal ions. The reaction formula, in the case where the above reducing agent is used and samarium diiodide (3.2 equivalents) is used with silicon bromide as silicon halide (one equivalent), may be expressed as follows.

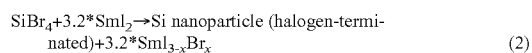

$$\mathrm{SiBr_4 + 3.2^*SmI_2 \rightarrow Si\ nanoparticle\ (halogen\text{-}terminated) + 3.2^*SmI_{3-x}Br_x} \quad (2)$$

The rare earth iodide is a reducing agent utilizing a change in valence and, thus, unlike charge transfer complexes such as NN complexes, does not produce any aromatic molecule as a by-product. This is advantageous in that extraction and purification as post steps can be easily carried out.

In addition to silicon chloride, the supply source of the silicon atom can be selected from silicon bromide, silicon iodide, tetramethoxysilane, tetraethoxysilane and the like.

The inert organic solvent is unreactive with the above reducing agent and silicon chloride. Such solvents usable herein include ether bond-containing solvents such as glyme, tetrahydrofuran and diethyl ether.

Not only silicon nanoparticles described here but also germanium nanoparticles, diamond nanoparticles, tin nanoparticles and the like can be prepared substantially the same manner as described above. The germanium nanoparticles are synthesizable from germanium chloride and the NN complex, the diamond nanoparticles are synthesizable from carbon tetrabromide and the NN complex, and the tin nanoparticles are synthesizable from tin chloride and the NN complex. In any event, the crystal can be selectively grown on one atom generation basis, that is, one atom generation by one atom generation.

3-b) Production Process of Two-Element Group 4 Compound Semiconductor Nanoparticles This production process is the same as the production process of one-element semiconductor particles, except that two different molecules are used as supply sources of group 4 atoms constituting the group 4 compound.

Specifically, in another production process of semiconductor particles according to the present invention, in a group 4 semiconductor material selected from silicon, germanium, carbon, tin, and lead, when a molecule composed of one group 4 atom A and four electron-withdrawing groups X is represented by $AX_4$, a molecule composed of a group 4 atom B, different from the atom A, and the electron-withdrawing group X is represented by $BX_4$, and a charge transfer complex composed of one alkali atom M and one aromatic molecule Y is represented by MY, in chemically reacting the above molecule with the above charge transfer complex in an inert organic solvent, they are added repeatedly a plurality of times in the order of $AX_4$, MY, $BX_4$, and MY, or in the order of MY, $BX_4$, MY, and $AX_4$, in the order of $BX_4$, MY, $AX_4$, and MY, or in the order of MY, $AX_4$, MY, and $BX_4$, whereby particles can be grown while regulating the size of a three-dimensional nanostructure of two atoms A and B on an atomic level.

The formation of nanoparticles will be described by taking germanium carbon compound nanoparticles as an example.

Figure 5:
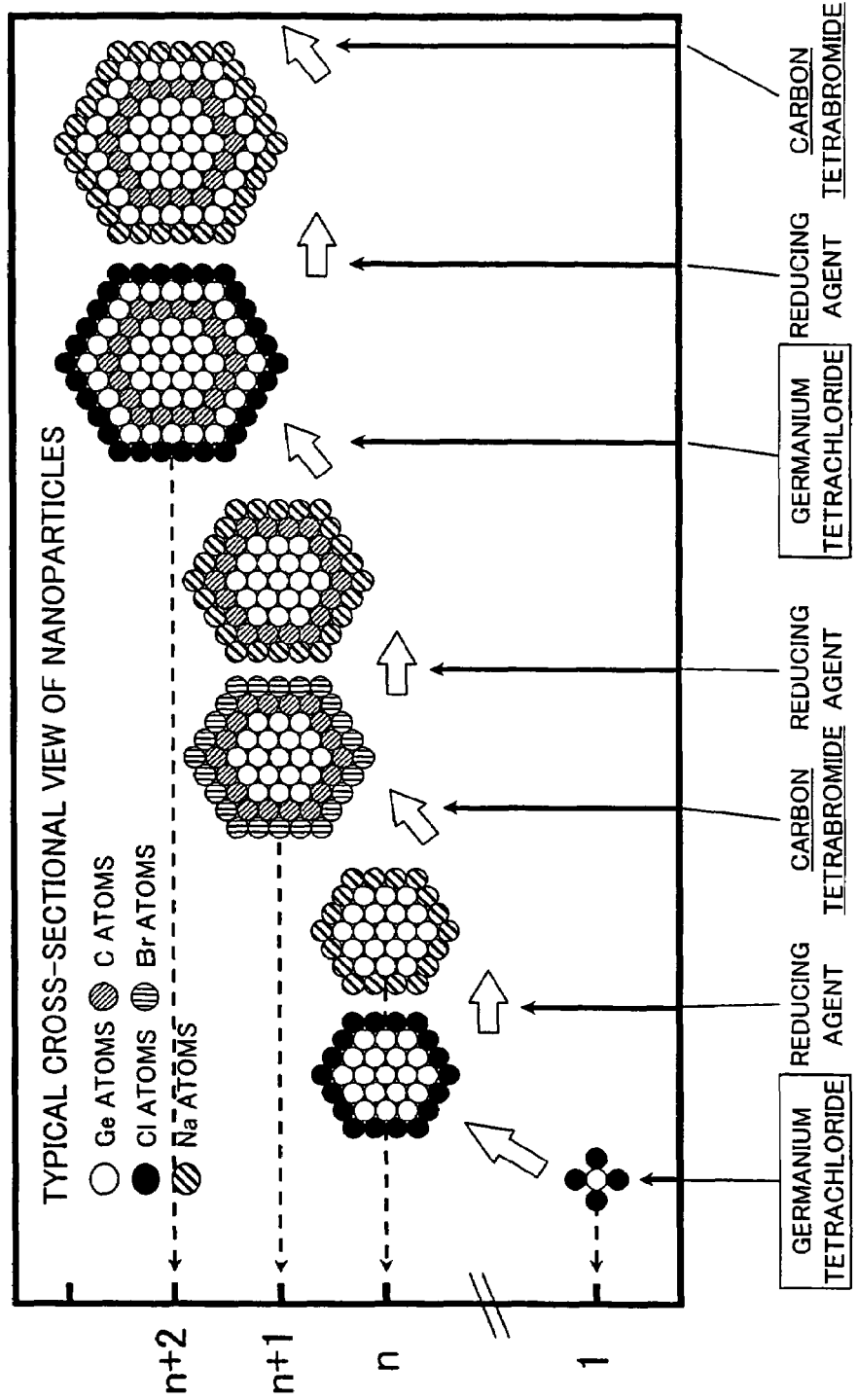
FIG. 5 is a typical diagram illustrating the synthesis of two-element group 4 compound semiconductor nanoparticles involved in the production process of the present invention.

FIG. 5 is a typical diagram illustrating the method for synthesizing of the two-element system. As with FIG. 3, in FIG. 5, the abscissa represents the synthesis procedure, and the ordinate represents the atom generation. As can be seen from the drawing, crystal growth of germanium carbon compound nanoparticles having a diamond structure (cubic zinc sulfide structure), in which the germanium atom generation and the carbon atom generation are alternately arranged, can be achieved by repeating addition of reagents in a regular order by a plurality of cycles, one cycle consisting of addition of reagents in the order of germanium tetrachloride→NN complex→carbon tetrabromide→NN complex.

This will be described in more detail. In FIG. 5, since the synthesis starts with germanium tetrachloride, the seed crystal is germanium nanoparticle. As with the above-described one-dimensional system, the seed crystal originally has a chlorine-terminated surface. When the NN complex is continuously added, however, the surface is changed to a sodium-terminated surface. Next, when carbon tetrabromide is added, the surface sodium atom is eliminated in the form of NaBr from the surface. On the other hand, carbon tetrabromide loses its bromine atom as a result of reduction and is chemically bonded to the surface of the nanoparticles, whereby nanoparticles having a chlorine-terminated outermost surface in which the germanium seed crystal is covered by the carbon atoms by one atom generation are produced. Thereafter, the NN complex, germanium tetrachloride, and carbon tetrabromide are continuously added in the regular order to provide germanium carbon nanoparticles comprising alternately grown germanium atoms and carbon atoms.

The germanium nanoparticles as primary seed crystals can be regulated to small and uniform-sized seed crystals of up to a few atom generations by regulating synthesis conditions (for example, temperature, concentration, and stirring speed).

According to the method of the present invention, except for the seed crystal part, regularly arranged group 4 compound nanoparticles of two or more group 4 elements can be prepared. In general, the synthesis of this regularly arranged compound is very difficult. The reason for this is as follows. For example, in the germanium carbon compound, germanium and carbon are each a 4-coordination compound and thus can be well mixed with each other. As a result, they are less likely to take a regularly arranged structure but are likely to take an irregularly arranged structure.

In addition to the germanium-carbon compound nanoparticles, other two-element group 4 compound nanoparticles can be prepared including silicon-germanium compound, silicon-carbon compound, silicon-tin compound, silicon-lead compound, germanium-tin compound, germanium-lead compound, and tin-lead compound nanoparticles.

Further, in addition to one or more group 4 elements, transition metal elements other than the group 4 element, preferably transition metal elements which can be brought to 4-coordination elements, for example, titanium, vanadium, zirconium, hafnium, and manganese can be selected. In this case, for example, silicon-titanium compound, silicon-vanadium compound, silicon-zirconium compound, silicon-hafnium compound, silicon-manganese compound, germanium-titanium compound, germanium-vanadium compound, germanium-zirconium compound, germanium-hafnium compound, germanium-manganese compound, carbon-titanium compound, carbon-vanadium compound, carbon-zirconium compound, carbon-hafnium compound, carbon-manganese compound, tin-titanium compound, tin-vanadium compound, tin-zirconium compound, tin-hafnium compound, tin-manganese compound, lead-titanium compound, lead-vanadium compound, lead-zirconium compound, lead-hafnium compound, and lead-manganese compound nanoparticles can be prepared.

Depending upon applications, two-element nanoparticles having an arranged structure different from the regularly arranged structure can also be prepared. When one of the atoms constituting the two-element system is atom A while the other atom is atom B, a regularly arranged structure of . . . ABAB . . . , as well as a structure having arbitrary atom arrangements for respective generations, for example, a structure of . . . AABBAABB . . . or . . . AABAAB . . . , or a totally randomly arranged structure of . . . AABABBBBABAA BBB . . . can be prepared.

In a three-element or higher multi-element system, regularly arranged or irregularly arranged group 4 nanoparticles can also be prepared.

Specifically, in still another production process of semiconductor particles according to the present invention, in a group 4 semiconductor material selected from silicon, germanium, carbon, tin, and lead, when a molecule composed of one group 4 atom A and four electron-withdrawing groups X is represented by $AX_4$, a molecule composed of a group 4 atom B different from the atom A and an electron-withdrawing group X is represented by $BX_4$, a molecule composed of a group 4 atom C, different from the atoms A and B, and an electron-withdrawing group X is represented by $CX_4$, a molecule composed of a group 4 atom D, different from the atoms A, B and C, and an electron-withdrawing group X is represented by $DX_4$, and a molecule composed of a group 4 atom E, different from the atoms A, B, C and D, and an electron-withdrawing group X, is represented by $EX_4$, and a charge transfer complex composed of one alkali atom M and one aromatic molecule Y is represented by MY, in chemically reacting the above molecule with the above charge transfer complex in an inert organic solvent, two or more molecules are selected from the molecules $AX_4$, $BX_4$, $CX_4$, $DX_4$, and $EX_4$ and are added repeatedly a plurality of times in the order of the selected molecules and the charge transfer complex or in the order of the charge transfer complex and the selected molecules, whereby particles can be grown while regulating the size of a three-dimensional nanostructure of two or more desired group 4 atoms on an atomic level.

In a further production process of semiconductor particles according to the present invention, in a group 4 semiconductor material selected from silicon, germanium, carbon, tin, and lead, when a molecule composed of one group 4 atom A, and four electron-withdrawing groups X is represented by $AX_4$, a molecule composed of one transition metal atom Z and four electron-withdrawing groups X is represented by $ZX_4$, and a charge transfer complex composed of one alkali atom M and one aromatic molecule Y is represented by MY, in chemically reacting the above molecule with the above charge transfer complex in an inert organic solvent, they are added repeatedly a plurality of times in the order of $AX_4$, MY, $ZX_4$, and MY, or in the order of MY, $ZX_4$, MY, and $AX_4$, in the order of $ZX_4$, MY, $AX_4$, and MY, or in the order of MY, $AX_4$, MY, and $ZX_4$, whereby particles can be grown while regulating the size of a three-dimensional nanostructure of two atoms A and Z on an atomic level.

Silicon-germanium-carbon nanoparticles and the like can be prepared by the above methods.

Further, a part of one-element, two-element, and multi-element nanoparticles may be replaced by a luminescent impurity atom, for example, with an ion of a rare earth metal belonging to the lanthanide group or an ion of a transition metal belonging to the iron group. Since the rare earth ion is generally a 3-coordination ion, it cannot be bonded to one atom among adjacent four silicon atoms. Accordingly, a 5-coordination atom, for example, a phosphorus atom, can be added for compensation.

Thus, the method according to the present invention has realized for the first time the synthesis of group 4 semiconductor nanoparticles with particle diameters accurately regulated to 2 to 5 nm in terms of spheres on an atomic level and the composition being regulated which preferably emit light with high efficiency. The group 4 nanoparticles, which are excellent and superior luminescence characteristics such as tailored luminescence wavelength as compared with the conventional group 4 nanoparticles, could have been realized for the first time by the above methods.

3-c) Method for Growth on Silicon Wafer

The method according to the present invention can realize the synthesis of group 4 semiconductor nanoparticles in a solution, as well as crystal growth of various filmy or particulate group 4 semiconductors on a silicon wafer. The procedure for this will be described.

At the outset, a silicon wafer is introduced into a synthesis chamber, where the silicon wafer is subjected to surface cleaning in an ultrahigh-vacuum state to precipitate silicon atoms.

Next, the vacuum is broken to return the pressure to the atmospheric pressure, and glyme is introduced into the synthesis chamber. In this case, in order to avoid surface contamination, an inert gas, which has a satisfactorily low dew point and has been satisfactorily dried, is then introduced into the synthesis chamber.

The surface of the wafer is then brought into contact with a halogen such as bromine ($Br_2$), or an acid such as bromic acid (HBr) or hydrochloric acid (HCl) to bring the surface silicon atom to a halogen-terminated surface. The surface of the untreated wafer is generally not a halogen-terminated surface. Accordingly, bonding a halogen to the group 4 element present on the surface of the wafer by the above treatment renders the wafer surface bondable to a sodium atom.

The wafer surface can be halogenated by a method different from the above method. For example, for a chlorine-terminated surface can be formed by treating the wafer surface with hydrofluoric acid (HF) or ammonium fluoride ($NH_4F$) to once bring the wafer surface to a hydrogen-terminated surface and then subjecting the wafer to treatment using benzoyl peroxide or the like as a radical initiator in chlorobenzene containing a proper amount of phosphorus pentachloride ($PCl_5$) or chlorine ($Cl_2$) to bring the wafer surface to a chlorine-terminated surface. A bromine-terminated surface can be formed by once bringing the wafer surface to a hydrogen-terminated surface and then subjecting the wafer to treatment using benzoyl peroxide or the like as a radical initiator with bromotrichloromethane ($CBrCl_3$).

Next, the NN complex is added to allow sodium atom to be adsorbed on the surface silicon atom. In effect, the silicon wafer surface is brought to a sodium-terminated surface.

Next, when one-element group 4 semiconductor, for example, silicon, is grown on a wafer, silicon chloride and the NN complex may be alternately added repeatedly according to the procedure described in the above sections. A regularly arranged two-element group 4 semiconductor, for example, a germanium-carbon compound, can be grown by repeating addition of reagents in a regular order by a plurality of cycles, one cycle consisting of addition of reagents in the order of germanium tetrachloride→NN complex→carbon tetrabromide→NN complex according to the procedures described in the above sections.

A part of irregularly arranged two-element compounds, three-element or higher multi-element compounds, and one-element/two-element/multi-element synthesized products may be replaced by a luminescent impurity atom.

The form of the finally produced synthesized product greatly depends upon the surface density of the first adsorbed sodium atom. When the sodium atom is densely adsorbed on the silicon surface, film growth occurs. On the other hand, when the sodium atom is coarsely adsorbed on the silicon surface, particle growth occurs. Therefore, the regulation of the amount of sodium atom adsorbed is important. The amount of sodium atom adsorbed can be regulated by monitoring the adsorption of sodium atom on a real time basis, for example, by infrared reflection spectroscopy.

EXAMPLES

Example 1

Synthesis of Silicon Nanoparticles

Figure 6:
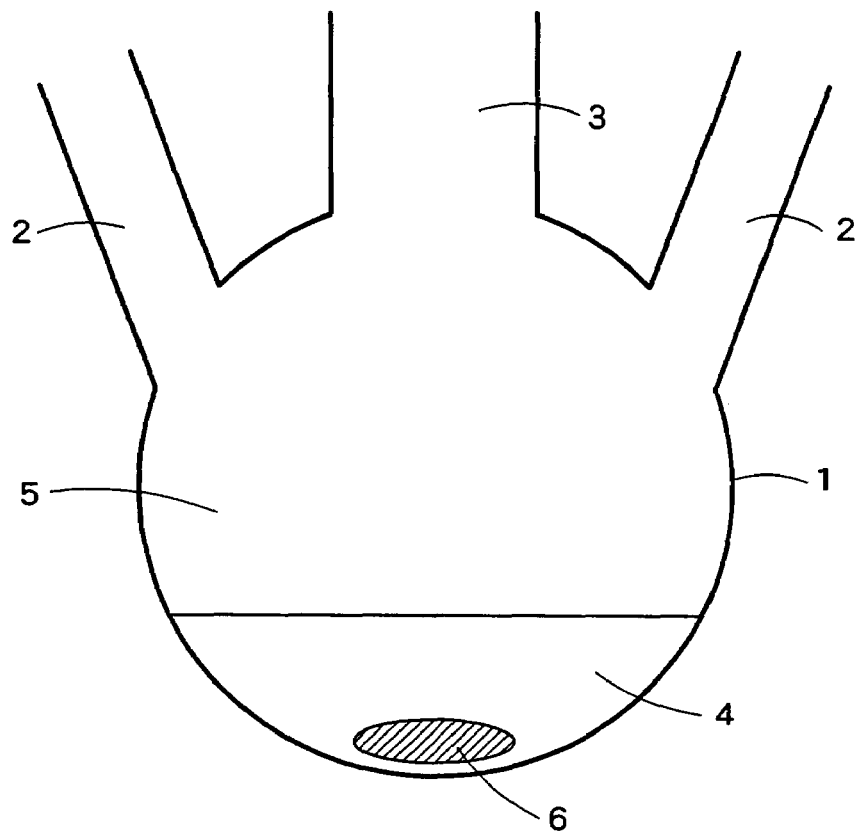
FIG. 6 is a schematic cross-sectional view of a synthesizing apparatus used in a first example of the present invention.

FIG. 6 is a typical diagram showing a synthesis apparatus used in the present invention. A four-necked flask 1 as a reactor has openings 2 and 3, and the inside 5 has been purged with an argon gas (dew point −80° C. or below) and has been satisfactorily dried. A dropping funnel or a cooling tube (not shown) is mounted in the opening 2 or 3. In the production process of the present invention including this Example, the synthesis should be carried out in a flask of which the atmosphere has been regulated, because air components such as water and oxygen are connected directly to contamination of nanoparticles.

In order to synthesize silicon nanoparticles, 100 ml of a 5 mmolar solution of silicon chloride dissolved in anhydrous glyme is provided in the flask. This solution is kept at room temperature, and a 0.2 molar anhydrous glyme solution of NN complex is slowly added dropwise from the opening 2 through the dropping funnel while stirring with a stirrer 6 at a speed of 600 rpm.

The anhydrous glyme solution of the NN complex is a deep green liquid. When this NN complex solution is added dropwise to the colorless and transparent silicon chloride glyme solution, the color of the solution 4 in the flask is first changed to a cream color. When the addition of the NN complex is further continued until the amount of the dropwise added NN complex reaches about 20 mmol, the color of the solution is suddenly changed to a deep red color.

As soon as the color of the solution in the flask begins to change to a deep red color and the color change reaches a steady state, silicon chloride is slowly added dropwise. When the amount of the dropwise added silicon chloride reaches about 1 mmol, the color of the solution is again changed to a cream color.

Thereafter, using the color of the solution within the flask as an index, upon a change in color of the solution to a cream color, the dropwise addition of silicon chloride is stopped and the NN complex solution is added. Next, upon a change in color to a deep red color, the dropwise addition of the NN complex solution is stopped, and silicon chloride is again added. The above procedure is repeated. Excluding the silicon chloride previously charged into the flask, repetition of the dropwise addition of the NN complex solution and the dropwise addition of silicon chloride in that order four times can result in the synthesis of chlorine-terminated silicon nanoparticles.

Chlorine-terminated silicon nanoparticles, NaCl, and neutralized naphthalene molecules are present together in the creamy solution. It is considered that, in the chlorine-terminated nanoparticles, electrons are drawn from the silicon atom to the chlorine atom to partially positively electrify the silicon atom.

On the other hand, in the deep red solution, it is considered that sodium-terminated silicon nanoparticles are produced. Negatively charged silicon anions are known to have a red body color. Thus, it is considered that, in sodium-terminated silicon nanoparticles, electrons are supplied from the sodium atom to the silicon atom to partially negatively electrify the silicon atom, resulting in a red body color. A change in color of the solution to a deep red color by introducing the NN complex is an indirect evidence of sodium-termination of the surface of the nanoparticles.

When the chlorine-terminated silicon nanoparticle produced in the flask are taken out to the air, the silicon nanoparticles are easily hydrolyzed and oxidized. Therefore, subsequently, surface stabilization treatment is carried out in the flask.

Butyl alcohol (200 mmol) is slowly added dropwise to the flask through the dropping funnel, followed by stirring at room temperature for 24 hr. This can realize the production of silicon nanoparticles as a contemplated product, which have been covered by butoxy groups and have been surface-stabilized, in the flask. NaCl and naphthalene are produced as by-products.

Hexane (100 ml) can be introduced into the flask, followed by thorough stirring to selectively extract silicon nanoparticles and naphthalene. The extracted hexane solution may be washed three times with pure water through a separatory funnel to remove the remaining NaCl for purification. The purified hexane solution may be dehydrated over magnesium sulfate.

Thereafter, naphthalene and hexane may be removed by vacuum distillation for purification to give silicon nanoparticles as a contemplated product.

Observation under an electron microscope reveals that the average particle diameter of the silicon part in the silicon nanoparticles thus synthesized is about 2.1 nm. The composition analysis of constituent elements reveals that the content of both chlorine and oxygen (wt %) is low and approximately a value of detection limit of the apparatus. Therefore, the above synthesis method can be said to be one which can produce high-purity nanoparticles. As compared with nanoparticles produced by the Grignard method, the amount of impurity atoms can be significantly reduced (1 wt % for chlorine and 10 wt % for oxygen).

Silicon nanoparticles thus obtained can be dissolved in hexane to examine fluorescence properties. A luminescent spectrum obtained by ultraviolet light excitation shows that the peak luminescence wavelength is 525 nm and the spectrum half-value width is about 60 nm. The luminescence quantum efficiency can be determined by using Rhodamine 6G dye as a reference. Thus, silicon nanoparticles with excellent luminescence characteristics, which has an efficiency of about 30 to 60%, can be realized.

Example 2

Regulation of Particle Diameter

In Example 2, silicon nanoparticles are synthesized in the same manner as in Example 1, except that, in order to regulate the particle diameter of silicon nanoparticles, the number of times of the dropwise addition of the NN complex solution and the number of times of the dropwise addition of silicon chloride are each increased from four times to twelve times.

Observation under an electron microscope reveals that the average particle diameter of the silicon part in the silicon nanoparticles thus synthesized is about 3 nm. A fluorescent spectrum obtained by photoexcitation shows that the peak luminescence wavelength is 630 nm and the spectrum half-value width is about 80 nm. Thus, silicon nanoparticles with a large particle diameter and with excellent luminescence characteristics, which has a luminescent quantum efficiency of about 10 to 40%, can be realized. According to the present invention, the particle diameter can be regulated by the number of times of the dropwise addition and, in its turn, the luminescence peak wavelength can be regulated.

Example 3

EL Light Emitting Element

Figure 7:
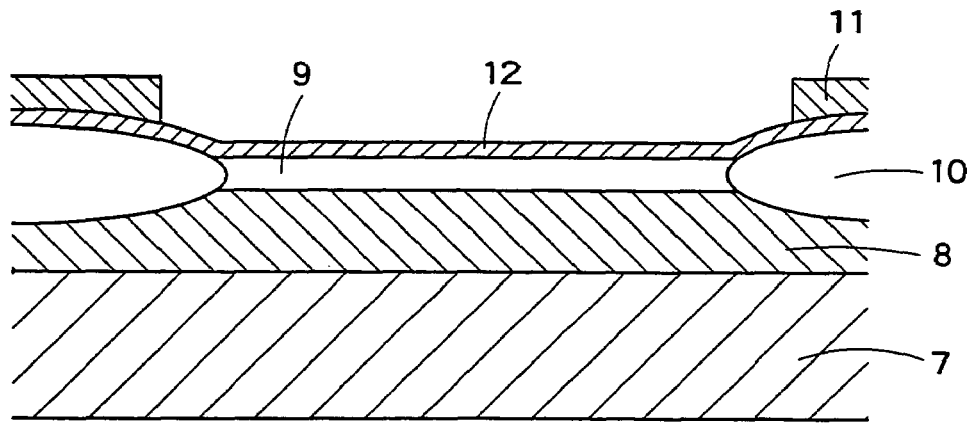
FIG. 7 is a schematic cross-sectional view of a light emitting element used in a third example of the present invention.

FIG. 7 is a schematic cross-sectional view of a light emitting element of an example of the present invention. This light emitting element can be formed on a silicon wafer and can include a $p^-$ Si layer 8 provided on a $p^+$ Si layer 7 as a p electrode, an amorphous Si layer 12 as a counter n electrode, and an active layer 9 formed of a packed layer of silicon nanoparticles. The light emitting element shown in FIG. 7 further includes an $SiO_2$ layer 10 and a pad electrode 11. The light emitting element is electrically connected to an electrode lead wire (not shown).

The particle diameter of the silicon nanoparticles used in the active layer can be selected depending upon the luminescence wavelength. Here blue luminescent nanoparticles having an average particle diameter of 2.1 nm are taken as an example.

This light emitting element can be driven under conditions of 20 mA and 4 V, and a very good EL efficiency of 5 cd/A can also be realized.

Example 4

Wafer Coating

In this Example, a germanium-carbon compound is coated onto a silicon wafer. The principle of the construction of the synthesis apparatus in this Example is the same as that shown in FIG. 6, except that, in order to cope with ultrahigh vacuum, the whole reactor is metallic and a heater is additionally provided for regulating the wafer temperature.

Prior to the synthesis, a flask as a reactor in which a wafer having a size of 1 cm square is placed is evacuated to ultrahigh vacuum, and the wafer temperature is raised in this atmosphere to perform surface cleaning treatment for removing impurity atoms other than the silicon atom. The cleaning treatment is carried out according to the conventional LSI process.

Next, the vacuum within the flask is broken, and the pressure is returned to the atmospheric pressure. Anhydrous glyme (100 ml) is introduced into the flask. In this case, in order to avoid surface contamination, the inside of the flask is purged with a satisfactorily dried argon gas (dew point −80° C. or below).

The silicon surface is brought to a sodium-terminated surface by slowly adding a 0.1 molar anhydrous glyme solution of NN complex dropwise to the solution and stirring the solution at 600 rpm to allow the NN complex to collide against the wafer surface for a reaction. Since the silicon atom is present in an amount of about $10^{15}$ (about 2 nanomoles) on the silicon wafer surface having a size of 1 cm square, the NN complex is added dropwise in an excessive amount (1 mmol) from the viewpoint of realizing a densely sodium-terminated surface.

The sodium-terminated wafer surface can be coated with a germanium-carbon film by repeating addition of reagents in a regular order by a plurality of cycles, one cycle consisting of addition of reagents in the order of germanium tetrachloride→NN complex→carbon tetrabromide→NN complex. In this case, all the reagents are added dropwise in an excessive amount so that the surface reaction proceeds satisfactorily. Since carbon tetrabromide is a solid reagent, it is previously dissolved in glyme to provide a 0.1 molar solution.

This dropwise addition cycle is repeated 100 times. Thereafter, in order to stabilize the surface of the synthesized germanium-carbon film, butyl alcohol (1 mol) is slowly added dropwise, and the mixture is stirred at room temperature for 24 hr. Thus, a germanium-carbon film, which has been stabilized by coating with butoxy group as an contemplated product, can be produced on the wafer surface.

The wafer is taken out of the flask and can be washed with pure water and hexane to remove naphthalene, NaCl, unreacted reagents, and other by-products deposited on the wafer. Thus, a wafer coated with a germanium-carbon film as a contemplated product can be prepared.

Observation of the section under an electron microscope reveals that the thickness of the synthesized coating layer is approximately between 20 nm and 30 nm. According to the composition analysis of constituent elements reveals that germanium and carbon are detected from the coating layer at a ratio of Ge:C=1:1. Further, the contents of chlorine, oxygen, and sodium are low values close to the detection limit of the apparatus, indicating that the film formation method can form a high-purity film.

Upon excitation of the film thus obtained by ultraviolet light, a luminescence spectrum with a peak in a near infrared region is obtained. The luminescence quantum efficiency is about 50%, and, thus, a group 4 compound semiconductor having excellent luminescence characteristics can be realized.

Example 5

In Example 5, silicon nanoparticles are synthesized in the same manner as in Example 1, except that a reducing agent different from the NN complex, a lithium-di-t-butylbiphenyl charge transfer complex (LDBB complex), is used.

Observation under an electron microscope reveals that the average particle diameter of the silicon part in the silicon nanoparticles thus synthesized is 2.2 nm. A fluorescent spectrum obtained by photoexcitation shows that the peak luminescence wavelength is 530 nm and the spectrum half-value width is about 60 nm. The luminescence quantum efficiency is approximately 30 to 50%, and, thus, silicon nanoparticles having a large particle diameter with excellent luminescence characteristics can be realized. This Example demonstrates that, in addition to the NN complex, a charge transfer complex comprising an alkali metal and an aromatic organic molecule can be used as the reducing agent.

Example 6

In Example 6, silicon nanoparticles are synthesized in the same manner as in Example 1, except that the type of the reducing agent and the type of the silane compound are changed. Specifically, in the synthesis of silicon nanoparticles, samarium diiodide is used as the reducing agent, and silicon bromide is used as the silane compound.

In the same manner as in Example 1, the silicon nanoparticles are surface-stabilized and are then extracted and purified. Observation of the purified nanoparticles under an electron microscope reveals that, as with Example 1, the average particle diameter is 2.0 nm. The fluorescent characteristics are also the same as those in Example 1.

This Example demonstrates that a rare earth iodide can be used instead of the charge transfer complex as the reducing agent.

What is claimed is:

1. A method for coating a semiconductor surface, comprising:
   (1) drop-wise adding an inert organic solvent-soluble, electron-donating reducing agent to a solution of a semiconductor material which comprises a group 4 element selected from the group consisting of silicon, germanium, carbon, and tin, in the inert organic solvent, thereby obtaining an intermediate where the surface of the semiconductor material is coated with a metal derived from said reducing agent; and
   (2) drop-wise adding a compound with an electron withdrawing group to the intermediate obtained in (2), said compound comprising an element selected from the group consisting of group 4 elements and transition metal elements, to coat the surface of the semiconductor material with a monoatomic layer of the group 4 element or the transition metal element derived from said compound with the electron withdrawing group.

2. The method for coating a semiconductor surface according to claim 1, wherein said reducing agent is a charge transfer complex or a rare earth iodide.

3. The method for coating a semiconductor surface according to claim 1, wherein said reducing agent is selected from the group consisting of sodium-naphthalene complexes, lithium-naphthalene complexes, lithium-di-t-butylbiphenyl, samarium diiodide, yttrium diiodide, and europium diiodide.

4. The method for coating a semiconductor surface according to claim 1, wherein the reaction of said reducing agent and the reaction of said compound with electron withdrawing group are repeated a plurality of times to coat the surface of the semiconductor material with the group 4 element or the transition metal element a plurality of times.

5. The method for coating a semiconductor surface according to claim 1, wherein said compound with electron withdrawing group comprises an element identical to the element contained in the semiconductor material.

6. The method for coating a semiconductor surface according to claim 4, wherein a part of said plurality of times of coating is carried out using a compound with electron withdrawing group containing an element different from the compound with the electron withdrawing group used in the other coating(s).

7. The method for coating a semiconductor surface according to claim 1, wherein the group 4 element atoms on said semiconductor surface have been terminated with a halogen before the reaction with the reducing agent.

8. A process for producing semiconductor particles, comprising allowing crystal growth to proceed by the method according to claim 1 using seed crystals as the semiconductor material.

9. The method for coating a semiconductor surface according to claim 1, wherein said semiconductor material is silicon chloride, said inert organic solvent-soluble, electron-donating reducing agent is sodium naphthalene, and said compound with an electron-withdrawing group is silicon chloride.

10. The method for coating a semiconductor surface according to claim 9, where a resulting coated semiconductor material has an average diameter of 2.1 nm.

11. The method for coating a semiconductor surface according to claim 1, wherein said semiconductor material is a silicon wafer, said inert organic solvent-soluble, electron-donating reducing agent is sodium naphthalene, and said compound with an electron-withdrawing group is a combination of germanium tetrachloride and carbon tetrabromide.

12. The method for coating a semiconductor surface according to claim 11, wherein a resulting coated semiconductor material has a coating layer with a thickness ranging from 20 to 30 nm.

13. The method for coating a semiconductor surface according to claim 12, wherein a Germanium:Carbon ratio within the coating layer is 1:1.

* * * * *